United States Patent
Ueno et al.

(10) Patent No.: US 7,759,700 B2
(45) Date of Patent: Jul. 20, 2010

(54) SEMICONDUCTOR DEVICE

(75) Inventors: Hiroaki Ueno, Osaka (JP); Manabu Yanagihara, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/593,016

(22) Filed: Nov. 6, 2006

(65) Prior Publication Data

US 2007/0126026 A1  Jun. 7, 2007

(30) Foreign Application Priority Data

Dec. 1, 2005  (JP) ............... 2005-347988

(51) Int. Cl.
*H01L 31/0256* (2006.01)

(52) U.S. Cl. .......................... 257/192; 257/12; 257/76; 257/77; 257/183; 257/193; 257/194; 257/195; 257/279; 257/E21.407; 257/E21.451; 257/E27.012; 257/E29.253; 438/167; 438/172; 438/174; 438/176; 438/192; 438/194; 438/169

(58) Field of Classification Search ............... 257/12, 257/76, 77, 183, 192–195, 279, 280, 287, 257/288, 488, 533, E21.407, E23.011, E21.451, 257/E27.012, E29.253; 438/167, 172, 174, 438/176, 192, 194, 169
See application file for complete search history.

(56) References Cited

U.S. PATENT DOCUMENTS

| 4,615,102 | A | * | 10/1986 | Suzuki et al. ............... 438/172 |
|---|---|---|---|---|
| 5,225,707 | A | * | 7/1993 | Komaru et al. ............... 257/513 |
| 5,329,154 | A | * | 7/1994 | Kishita et al. ............... 257/532 |
| 6,316,793 | B1 | | 11/2001 | Sheppard et al. |
| 2003/0075719 | A1 | * | 4/2003 | Sriram ........................ 257/77 |
| 2004/0104443 | A1 | * | 6/2004 | Ahn et al. .................... 257/412 |
| 2004/0224467 | A1 | * | 11/2004 | Basceri et al. ............... 438/240 |
| 2005/0095842 | A1 | * | 5/2005 | Ishikawa et al. ............ 438/625 |
| 2006/0043415 | A1 | * | 3/2006 | Okamoto et al. ............ 257/192 |
| 2006/0060895 | A1 | * | 3/2006 | Hikita et al. ................. 257/280 |
| 2007/0176215 | A1 | * | 8/2007 | Yanagihara et al. ......... 257/288 |

FOREIGN PATENT DOCUMENTS

| JP | 2002-016245 | | 1/2002 |
|---|---|---|---|
| JP | 2004214471 A | * | 7/2004 |
| JP | 2004-363563 | | 12/2004 |

* cited by examiner

*Primary Examiner*—Lynne A Gurley
*Assistant Examiner*—Meiya Li
(74) *Attorney, Agent, or Firm*—McDermott Will & Emery LLP

(57) ABSTRACT

A semiconductor device includes: a first group-III nitride semiconductor layer formed on a substrate; a second group-III nitride semiconductor layer made of a single layer or two or more layers, formed on the first group-III nitride semiconductor layer, and acting as a barrier layer; a source electrode, a drain electrode, and a gate electrode formed on the second group-III nitride semiconductor layer, the gate electrode controlling a current flowing between the source and drain electrodes; and a heat radiation film with high thermal conductivity which covers, as a surface passivation film, the entire surface other than a bonding pad.

5 Claims, 3 Drawing Sheets

SEMICONDUCTOR DEVICE

CROSS-REFERENCE TO RELATED APPLICATIONS

This application claims priority under 35 U.S.C. §119 on Patent Application No. 2005-347988 filed in Japan on Dec. 1, 2005, the entire contents of which are hereby incorporated by reference.

BACKGROUND OF THE INVENTION (a) Fields of the Invention

The present invention relates to semiconductor devices employing a group-III nitride semiconductor. In particular, the present invention relates to power semiconductor devices of a group-III nitride semiconductor handling large electric power and having excellent heat radiation.

(b) Description of Related Art

Group-III nitride semiconductors refer to compound semiconductors which are made of a compound of nitrogen (N) and aluminum (Al), boron (B), gallium (Ga), or indium (In) represented by a general formula $B_wAl_xGa_yIn_zN$ ($w+x+y+z=1$; $0 \leq w,x,y,z \leq 1$).

The group-III nitride semiconductors have advantages such as wide band gap and high breakdown voltage associated with this gap, high saturation speed and high mobility of electrons, and high electron concentration in a heterojunction. Because of these advantages, research and development of the group-III nitride semiconductors is being carried out to apply them to power devices having high breakdown voltage and handling large electric power. In particular, as basic structures of the device shown above, use is made of heterojunction structures formed by stacking group-III nitride semiconductor layers with modified group-III element contents and different band gaps, or quantum well structures or superlattice structures formed by stacking the multiple heterojunction structures mentioned above. This is because with such structures, the modulation factor of the electron concentration in the device can be controlled.

FIG. 4 shows one of the most general forms of a conventional nitride semiconductor device employing a heterojunction (see, for example, Japanese Unexamined Patent Publication No. 2002-16245 or U.S. Pat. No. 6,316,793). In FIG. 4, an operating layer 12 of gallium nitride (GaN) and a barrier layer 13 of aluminum gallium nitride ($Al_xGa_{1-x}N$) are sequentially stacked on a substrate 11. A heterojunction is formed at the interface at which the operating layer 12 and the barrier layer 13 with different band gaps are stacked.

A source electrode 14, a drain electrode 15, and a gate electrode 16 are formed on the barrier layer 13, and these electrodes operate as a heterojunction field effect transistor (abbreviated hereinafter to an HFET). The gate electrode 16 and the barrier layer 13 form a Schottky barrier. At the heterojunction interface between the barrier layer 13 and the operating layer 12, electrons are accumulated at a high concentration. The accumulated electrons result from the difference of the amount of the spontaneous polarization and the difference of the amount of the piezo-polarization between the barrier layer 13 and the operating layer 12, n-type impurities doped into the barrier layer 13 as appropriate, and other uncontrollable defects in the semiconductor layers, and they form a 2-dimensional electron gas (2DEG), which in turn acts as channel carriers for the field effect transistor. Typically, silicon nitride (SiN) is used as a surface passivation film 17.

As a semiconductor device of a group-III nitride semiconductor aiming at a higher breakdown voltage, the following structure is described (see, for example, Japanese Unexamined Patent Publication No. 2004-363563). This structure is characterized in that it includes: a conductive layer; an operating layer made of a group-III nitride semiconductor and formed above the conductive layer, a barrier layer made of a group-III nitride semiconductor and formed on the operating layer; a first source electrode, a drain electrode, and a gate electrode formed above respective portions of the barrier layer; a second source electrode connected to the first source electrode; and an interconnection member connecting the first source electrode and the conductive layer through a via hole penetrating the channel layer and the barrier layer.

In order to apply semiconductor devices using a group-III nitride semiconductor to power devices with high breakdown voltage, it is necessary to take measures to effectively radiate heat generated from the semiconductor device to the outside thereof. This is because the higher voltage and the larger current an application has, the greater amount of power is consumed in and the greater amount of heat is generated from the semiconductor device. In particular, for HFETs of multi-finger structures commonly employed as power semiconductor devices handling large electric power, because of their structures, heat generated in the operating layer stays ununiformly inside the device. In order to provide a uniform heat profile inside the semiconductor device, it is conceivable that a heat radiating component referred to as a radiation fin, a heat spreader, or the like is mounted on the semiconductor device. The use of such a heat radiating component, however, requires a space enough to accommodate the component, which goes against the trend toward savings in the device space. Therefore, a desirable power device is a semiconductor device which has a space-saving structure and can sufficiently exert the effect of heat uniformization.

SUMMARY OF THE INVENTION

An object of the present invention is to solve the conventional problems described above and to provide a semiconductor device using a group-III nitride semiconductor, saving space, and having a significant heat uniformization effect.

To attain the above object, a first semiconductor device according to the present invention is characterized in that the device includes: a first group-III nitride semiconductor layer formed on a substrate; a second group-III nitride semiconductor layer made of a single layer or two or more layers, formed on the first group-III nitride semiconductor layer, and acting as a barrier layer; and a source electrode, a drain electrode, and a gate electrode formed on the second group-III nitride semiconductor layer, the gate electrode controlling a current flowing between the source and drain electrodes, and as a surface passivation film, a heat radiation film with high thermal conductivity covers the entire surface other than a bonding pad. Thus, by covering the surface with the heat radiation film having high thermal conductivity, the group-III nitride semiconductor device capable of uniformizing its internal heat can be fabricated.

Moreover, preferably, a second semiconductor device according to the present invention includes: a first group-III nitride semiconductor layer formed on a substrate; a second group-III nitride semiconductor layer made of a single layer or two or more layers, formed on the first group-III nitride semiconductor layer, and acting as a barrier layer; and a first source electrode, a drain electrode, and a gate electrode formed on the second group-III nitride semiconductor layer, the gate electrode controlling a current flowing between the source and drain electrodes, the device further includes a via hole penetrating the operating layer, the barrier layer, and the substrate, and as a surface passivation film, a heat radiation film with high thermal conductivity covers the entire surface other than a bonding pad including the inside of the via hole. This is because with such a structure, the via hole can effectively uniformize heat staying ununiformly inside the semiconductor.

Furthermore, preferably, in the first or second semiconductor device having the structure in which the source electrode and a pair of drain electrodes located on both sides of the source electrode, respectively, are formed above the substrate, and in which a pair of gate electrodes are formed between the source electrode and the pair of drain electrodes, respectively, or this arrangement of the electrodes is aligned periodically multiple times, the entire surface other than the bonding pad is covered with the heat radiation film as the surface passivation film having high thermal conductivity. This is because the structure described above has the gate electrodes existing at multiple points, respectively, to exhibit a more significant ununiformity of a heat profile than the typical device structure and however the heat radiation film can uniformize this heat profile.

Preferably, the first or second semiconductor device uses, as the heat radiation film, diamond, diamond-like carbon (DLC), carbon, or a stacked film including at least two of the listed materials. This is because diamond, DLC, and carbon have insulative properties and concurrently a thermal conductivity equal to or higher than metal, so that they can effectively uniformize heat staying ununiformly inside the semiconductor.

Preferably, in the first or second semiconductor device, an insulating layer different from the heat radiation film is formed between the heat radiation film and the semiconductor layer. This is because a material with high adhesion can be provided to enhance the adhesion of the heat radiation film.

Preferably, in the first or second semiconductor device, the insulating layer between the heat radiation film and the semiconductor layer is made of a compound containing carbon. This is because the compound containing carbon particularly has a high adhesion to diamond, DLC, and carbon, so that the heat radiation film adheres more firmly to the semiconductor layer.

Preferably, in the first or second semiconductor device, the carbon-containing compound is titanium carbon (TiC) or aluminum carbon (AlC). This is because TiC and AlC particularly has a high adhesion to diamond, DLC, and carbon, so that the heat radiation film adheres more firmly to the semiconductor layer.

DETAILED DESCRIPTION OF THE PREFERRED EMBODIMENTS

First Embodiment

A semiconductor device according to a first embodiment of the present invention will be described with reference to FIG. 1.

Figure 1:
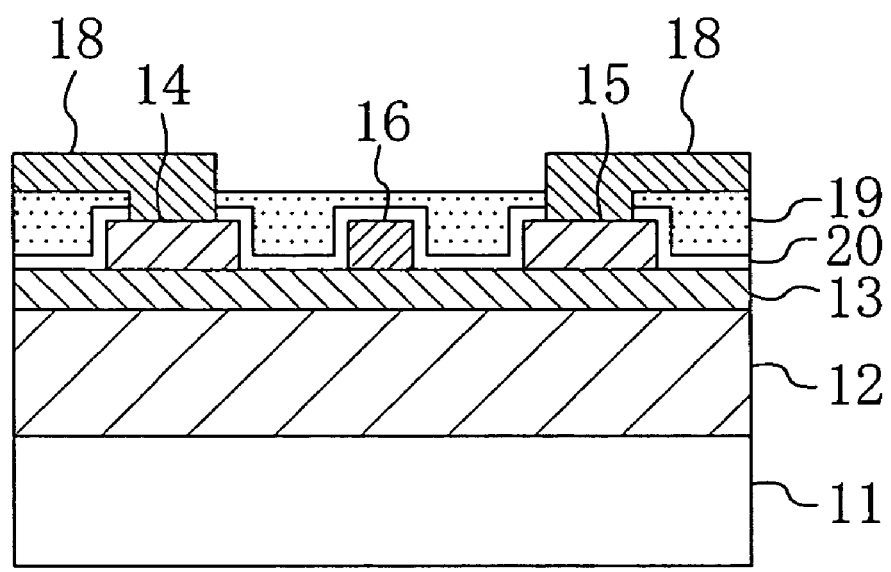
FIG. 1 is a sectional view of a semiconductor device according to a first embodiment of the present invention.

FIG. 1 schematically shows a cross section of the semiconductor device according to the first embodiment.

Referring to FIG. 1, a barrier layer 13 of $Al_xGa_{(1-x)}N$ ($0 \leq x \leq 1$) is stacked on an operating layer 12 of GaN formed on a substrate 11, and the operating layer 12 and the barrier layer 13 form a heterojunction interface. A source electrode 14 and a drain electrode 15 are formed away from each other, and a gate electrode 16 is formed between the source electrode 14 and the drain electrode 15. Bonding pad 18 is also provided connected to the source electrode 14 and/or the drain electrode 15. The surfaces of these electrodes and the barrier layer 13 are coated with an insulating film 20 made of a carbon compound (for example, titanium carbon (TiC) or aluminum carbon (AlC)) with high adhesion. The top of the insulating film 20 is coated with a diamond film 19 having high thermal conductivity and excellent heat radiation property as a heat radiation film. It is sufficient that the insulating film 20 has such a thickness that does not block heat inside the semiconductor from transmitting into the diamond film 19.

Second Embodiment

A semiconductor device according to a second embodiment of the present invention will be described with reference to FIG. 2.

Figure 2A:
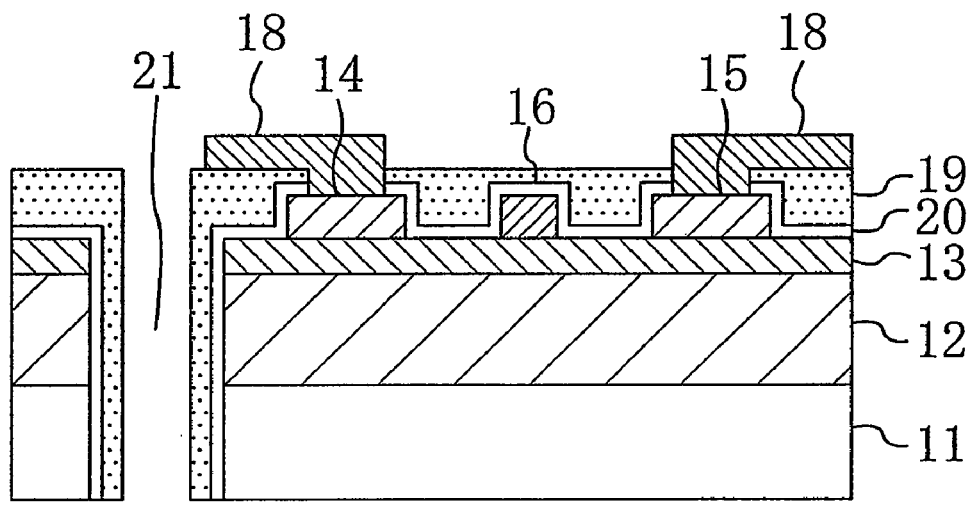
FIGS. 2A and 2B are sectional views of a semiconductor device according to a second embodiment of the present invention.

FIG. 2A schematically shows a cross section of the semiconductor device according to the second embodiment.

Referring to FIG. 2A, a barrier layer 13 of $Al_xGa_{(1-x)}N$ ($0 \leq x \leq 1$) is stacked on an operating layer 12 of GaN formed on a substrate 11, and the operating layer 12 and the barrier layer 13 form a heterojunction interface. A first source electrode 14A and a drain electrode 15 are formed away from each other, and a gate electrode 16 is formed between the first source electrode 14A and the drain electrode 15. The surfaces of these electrodes and the barrier layer 13 are coated with an insulating film 20 made of a carbon compound (for example, titanium carbon (TiC) or aluminum carbon (AlC)) with high adhesion. The top of the insulating film 20 is coated with a diamond film 19 having high thermal conductivity and excellent heat radiation property as a heat radiation film. These films also cover a via hole 21 penetrating the operating layer 12, the barrier layer 13, and the substrate 11. It is sufficient that the insulating film 20 has such a thickness that does not block heat inside the semiconductor from transmitting into the diamond film 19.

Figure 2B:
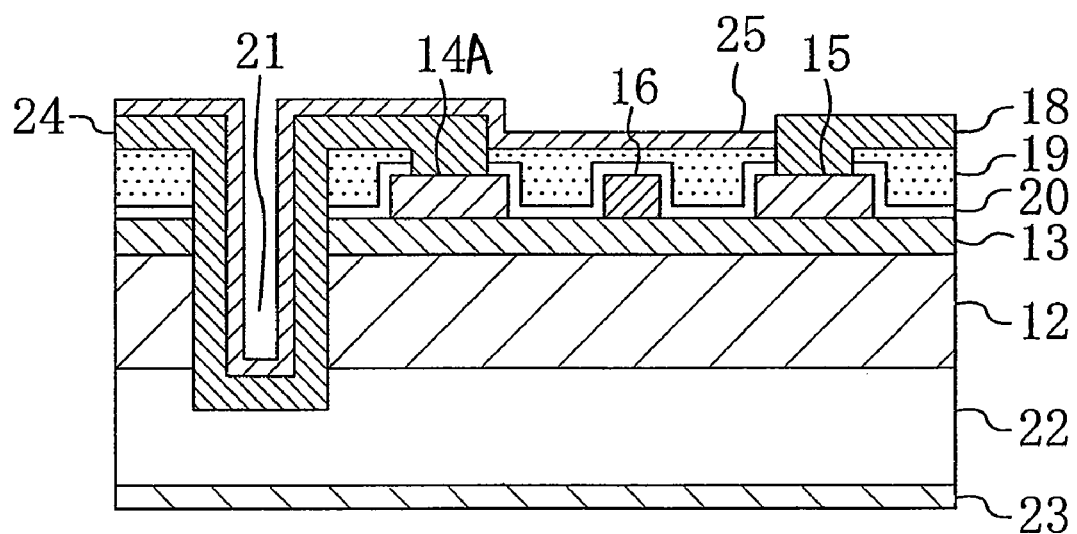

FIG. 2B schematically shows a cross section of another semiconductor device according to the second embodiment.

Referring to FIG. 2B, a barrier layer 13 of $Al_xGa_{(1-x)}N$ ($0 \leq x \leq 1$) is stacked on an operating layer 12 of GaN formed on, for example, a conductive Si substrate 22, and the operating layer 12 and the barrier layer 13 form a heterojunction interface. A first source electrode 14A and a drain electrode 15 are formed away from each other, and a gate electrode 16 is formed between the first source electrode 14A and the drain electrode 15. An insulating film 20 made of a carbon compound (for example, titanium carbon (TiC) or aluminum carbon (AlC)) with high adhesion is formed on the surface of the barrier layer 13 other than the electrodes 14A, 15 and 16. The top of the insulating film 20 is coated with a diamond film 19 having high thermal conductivity and excellent heat radiation property as a heat radiation film. The semiconductor device also includes a second source electrode 23 connected to the first source electrode 14, and an interconnection member 24 connecting the first source electrode 14A and the conductive substrate 22 through a via hole 21 penetrating the operating layer 12, the barrier layer 13, and the conductive substrate 22. As a surface passivation film, a diamond-like carbon (DLC)

film 25 with high thermal conductivity covers the entire interconnection member 24 including the portion thereof lying inside the via hole 21. It is sufficient that the insulating film 20 has such a thickness that does not block heat inside the semiconductor from transmitting into the diamond film 19. Note that the conductive Si substrate 22 may be any other type of semiconductor substrate, for example, SiC.

Third Embodiment

A semiconductor device according to a third embodiment of the present invention will be described with reference to FIG. 3.

Figure 3:
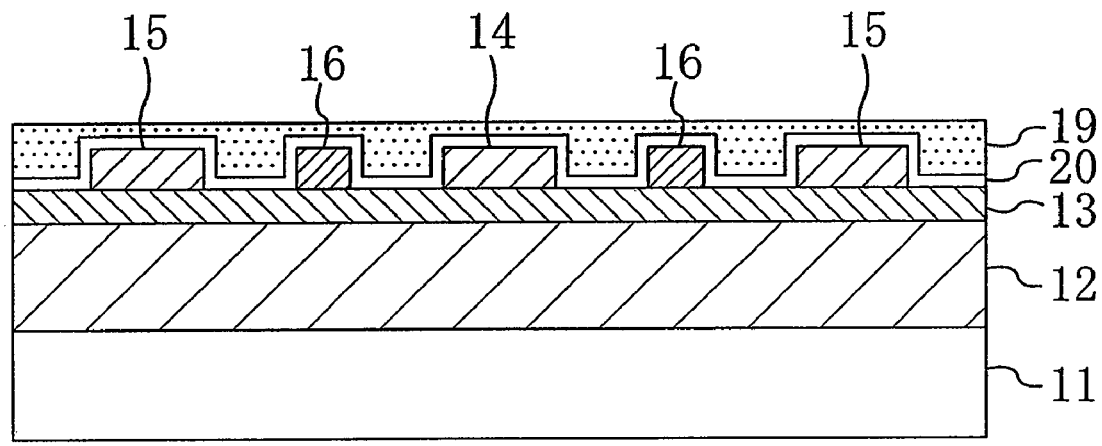
FIG. 3 is a sectional view of a semiconductor device according to a third embodiment of the present invention.
Figure 4:
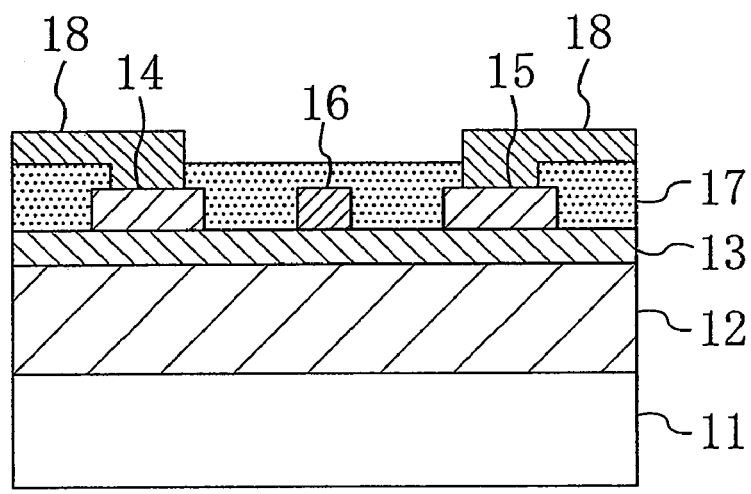
FIG. 4 is a sectional view of a conventional group-III nitride semiconductor device.

FIG. 3 schematically shows a cross section of the semiconductor device according to the third embodiment.

Referring to FIG. 3, a barrier layer 13 of $Al_xGa_{(1-x)}N$ ($0 \leq x \leq 1$) is stacked on an operating layer 12 of GaN formed on a substrate 11, and the operating layer 12 and the barrier layer 13 form a heterojunction interface. On the both sides of a source electrode 14, a pair of drain electrodes 15 are formed away from each other, and a pair of gate electrodes 16 are formed between the source electrode 14 and the pair of drain electrodes 15, respectively. The surfaces of these electrodes and the barrier layer 13 are coated with an insulating film 20 made of a carbon compound (for example, titanium carbon (TiC) or aluminum carbon (AlC)) with high adhesion. The top of the insulating film 20 is coated with a diamond film 19 having high thermal conductivity and excellent heat radiation property as a heat radiation film. It is sufficient that the insulating film 20 has such a thickness that does not block heat inside the semiconductor from transmitting into the diamond film 19. Note that such an arrangement of the electrodes and the like may be aligned periodically multiple times.

As described above, in the group-III nitride semiconductor device according to the present invention, the entire surface is covered with the heat radiation layer with high thermal conductivity. Thereby, the semiconductor device has a much more excellent thermal uniformity than the conventional group-III nitride semiconductor device. This structure eliminates an ununiform profile of heat generated in the semiconductor device during high power consumption, so that the temperature of the inside of the device is kept uniform. Therefore, the present invention is useful for a high-performance group-III nitride semiconductor device with excellent reliability, in particular for a power semiconductor device having high breakdown voltage, handling large electric power, and requiring high voltage and large current.

What is claimed is:

1. A semiconductor device comprising:
   a first group-III nitride semiconductor layer formed on a conductive substrate;
   a second group-III nitride semiconductor layer made of a single layer or two or more layers, formed on the first group-III nitride semiconductor layer, and acting as a barrier layer;
   a first source electrode, a drain electrode, and a gate electrode formed on the second group-III nitride semiconductor layer, the gate electrode controlling a current flowing between the first source electrode and the drain electrode;
   an interconnection member connecting the first source electrode and the conductive substrate through a via hole;
   a second source electrode connecting with the conductive substrate; and
   a heat radiation film with high thermal conductivity existing on an uppermost surface of the interconnection member,
   wherein the via hole is formed so as to penetrate the first group-III nitride semiconductor layer and the second group-III nitride semiconductor layer,
   the via hole does not penetrate conductive substrate,
   the interconnection member is directly on the first source electrode and covers the inside of the via hole, and
   the heat radiation film covers the interconnection member inside the via hole, and the heat radiation film has insulative properties.

2. The device of claim 1, wherein the heat radiation film is made of diamond, diamond-like carbon (DLC), carbon, or a stacked film including at least two of the listed materials from diamond, diamond-like carbon (DLC), and carbon.

3. The device of claim 1, wherein an insulating layer made of a different material from that of the heat radiation film is formed below the heat radiation film.

4. The device of claim 3, wherein the insulating layer is made of a compound containing carbon.

5. The device of claim 4, wherein the compound containing carbon is titanium carbide (TiC) or aluminum carbide (AlC).

* * * * *